(12) United States Patent
Akasaka et al.

(10) Patent No.: US 7,232,751 B2
(45) Date of Patent: Jun. 19, 2007

(54) SEMICONDUCTOR DEVICE AND MANUFACTURING METHOD THEREFOR

(75) Inventors: Yasushi Akasaka, Yokohama (JP); Kazuaki Nakajima, Tokyo (JP); Kiyotaka Miyano, Tokyo (JP); Kyoichi Suguro, Yokohama (JP)

(73) Assignee: Kabushiki Kaisha Toshiba, Kawaski-shi (JP)

( * ) Notice: Subject to any disclaimer, the term of this patent is extended or adjusted under 35 U.S.C. 154(b) by 58 days.

(21) Appl. No.: 11/047,975

(22) Filed: Feb. 2, 2005

(65) Prior Publication Data

US 2005/0130418 A1   Jun. 16, 2005

Related U.S. Application Data

(62) Division of application No. 09/708,043, filed on Nov. 8, 2000, now Pat. No. 6,893,980, which is a division of application No. 08/982,416, filed on Dec. 2, 1997, now Pat. No. 6,162,741.

(30) Foreign Application Priority Data

Dec. 3, 1996 (JP) .................................... 8-322934
Jun. 6, 1997 (JP) .................................... 9-149161

(51) Int. Cl.
    H01L 21/336    (2006.01)
(52) U.S. Cl. .............................. 438/625; 257/E21.004; 257/E21.2
(58) Field of Classification Search ................ 438/625, 438/773
    See application file for complete search history.

(56) References Cited

U.S. PATENT DOCUMENTS

| 4,074,300 | A |   | 2/1978  | Sakai et al. |
| 4,288,283 | A | * | 9/1981  | Umezaki et al. ............... 216/22 |
| 4,505,028 | A |   | 3/1985  | Kobayashi et al. |
| 4,574,177 | A | * | 3/1986  | Wang ..................... 219/121.41 |
| 4,873,163 | A | * | 10/1989 | Watakabe et al. ............... 430/5 |
| 5,763,321 | A | * | 6/1998  | Ohshima et al. ........... 438/618 |
| 5,834,846 | A | * | 11/1998 | Shinriki et al. ............. 257/754 |
| 5,843,820 | A | * | 12/1998 | Lu ............................. 438/243 |
| 5,907,188 | A |   | 5/1999  | Nakajima et al. |
| 5,910,021 | A | * | 6/1999  | Tabara ........................ 438/636 |
| 6,001,729 | A | * | 12/1999 | Shinriki et al. ............. 438/625 |
| 6,013,542 | A | * | 1/2000  | Yamazaki et al. .......... 438/132 |

(Continued)

FOREIGN PATENT DOCUMENTS

JP    7-94731    4/1995

(Continued)

Primary Examiner—Walter Lindsay, Jr.
Assistant Examiner—Thu-Huong Dinh
(74) Attorney, Agent, or Firm—Finnegan, Henderson, Farabow, Garrett & Dunner, L.L.P.

(57) ABSTRACT

According to the manufacturing method of the semiconductor device of the present invention, an oxide film is formed on a metal film formed on a main surface of a semiconductor substrate by exposing the metal film to the oxidizing gas. The oxide film is then reduced in a reducing atmosphere, and a protection film is formed on the surface of the metal film reduced in the reducing step. In this manner, the damage to the surface of the metal film can be prevented.

5 Claims, 12 Drawing Sheets

U.S. PATENT DOCUMENTS

| | | |
|---|---|---|
| 6,162,741 A | 12/2000 | Akasaka et al. |
| 6,376,379 B1 * | 4/2002 | Quek et al. ................. 438/692 |
| 6,391,796 B1 * | 5/2002 | Akiyama et al. ........... 438/763 |
| 6,495,115 B1 * | 12/2002 | Dunmead et al. ........... 423/440 |
| 6,753,253 B1 * | 6/2004 | Takahashi et al. .......... 438/676 |

FOREIGN PATENT DOCUMENTS

| | | |
|---|---|---|
| JP | 7-176627 | 7/1995 |
| JP | 8-037145 | 2/1996 |
| JP | 8-102534 | 4/1996 |

* cited by examiner

| | 1 | 2 | 3 | 4 | 5 | 6 | 7 | 8 | 9 | 10 |
|---|---|---|---|---|---|---|---|---|---|---|
| TEMPERATURE | UNDER 550°C | | | 700°C | | 780°C | | | | UNDER 550°C |
| PRESSURE | 760 Torr | UNDER 1mTorr | | ~0.5 Torr | | | | UNDER 1mTorr | | 760 Torr |
| ATMOSPHERE | N2 AIR | — | N2 | NH3 | N2 | N2 | NH3 + SiH2Cl2 | — | N2 | N2 |
| PROCESS | LOAD IN | EXHAUST | HEAT UP | REDUCTION | HEAT UP | HEAT RECOVERY | DEPOSITION | EXHAUST | COOL DOWN | LOAD OUT |

F I G. 2

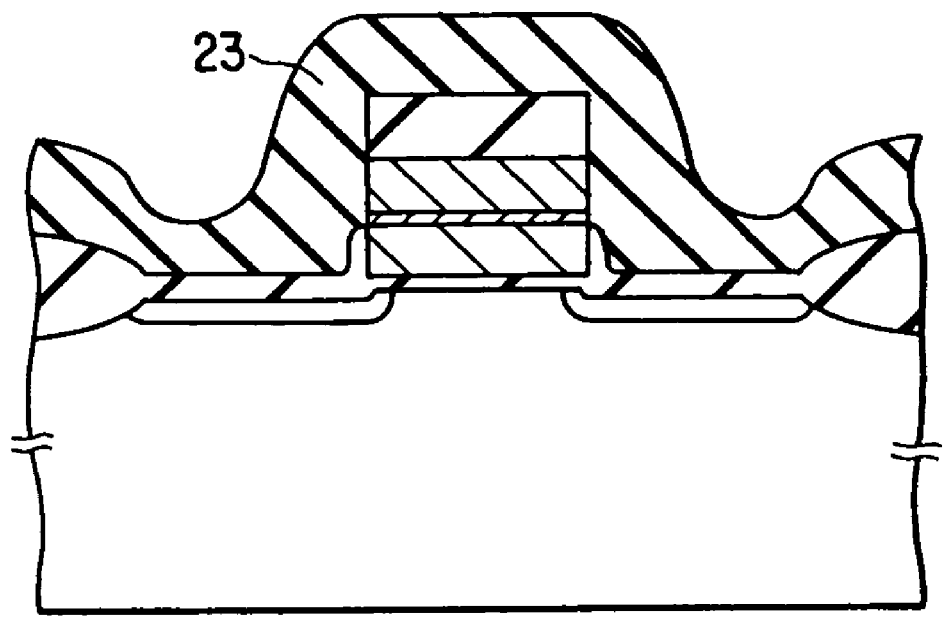
F I G. 4D
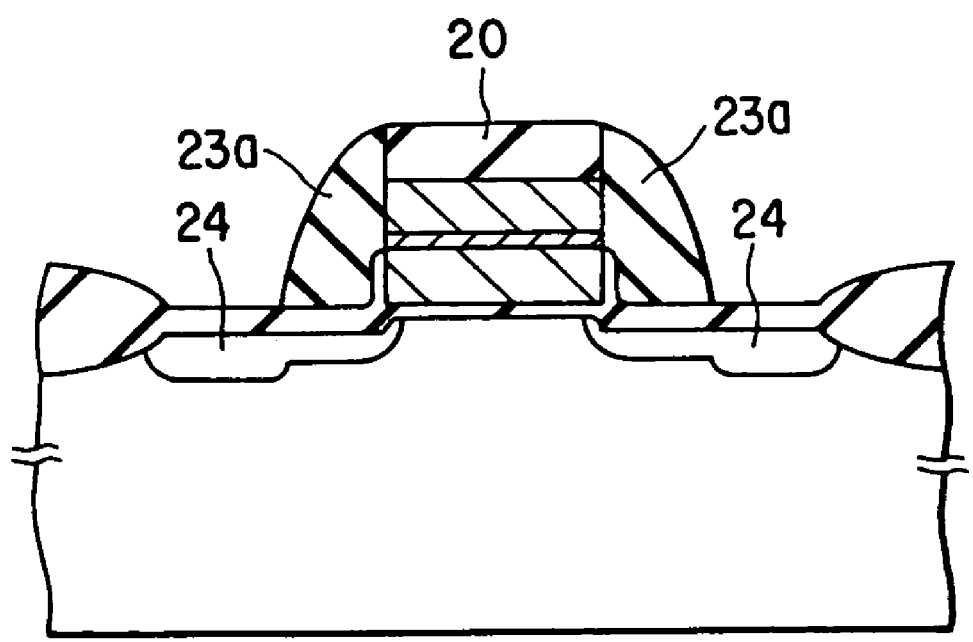
F I G. 4E

| | 1 | 2 | 3 | 4 | 5 | 6 | 7 | 8 | 9 | 10 |
|---|---|---|---|---|---|---|---|---|---|---|
| TEMPERATURE | UNDER 550°C | | | 700°C | | 800°C | | | | UNDER 550°C |
| PRESSURE | 760Torr | UNDER 1mTorr | 600Torr | | | | | UNDER 1mTorr | 600Torr | 760Torr |
| ATMOSPHERE | N₂ AIR | — | N₂ | H₂ + N₂ | N₂ | N₂ | H₂ + H₂O + H₂ | — | N₂ | N₂ |
| PROCESS | LOAD IN | EXHAUST | HEAT UP | REDUCTION | HEAT UP | HEAT RECOVERY | OXIDATION | EXHAUST | COOL DOWN | LOAD OUT |

FIG. 5

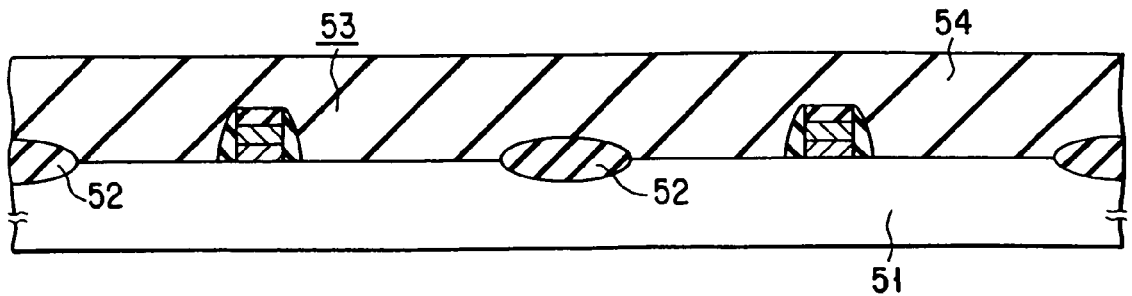
F I G. 8A
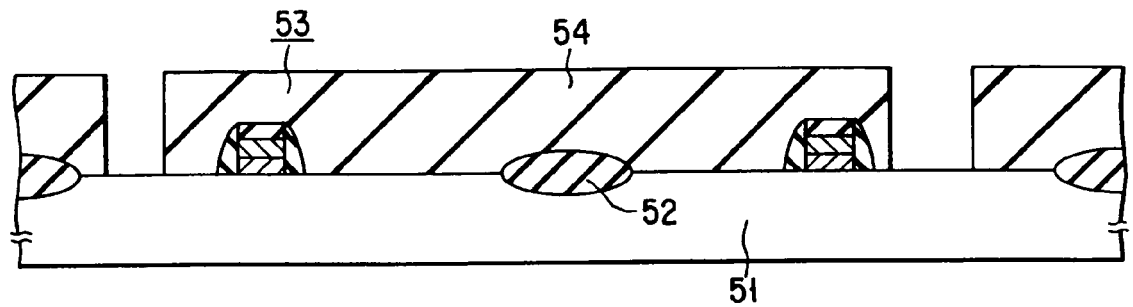
F I G. 8B
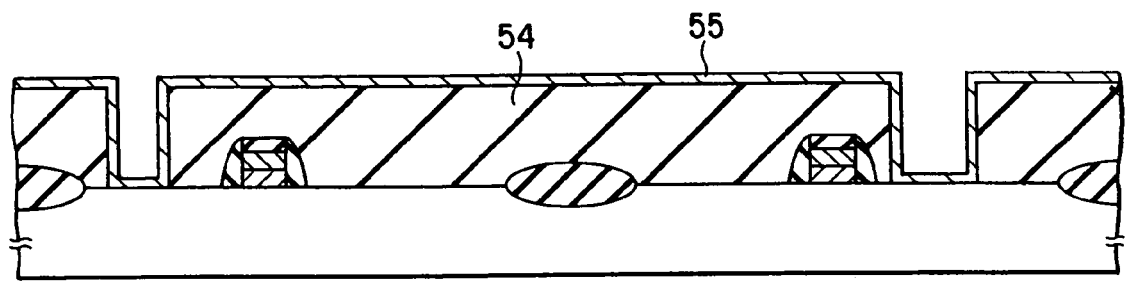
F I G. 8C
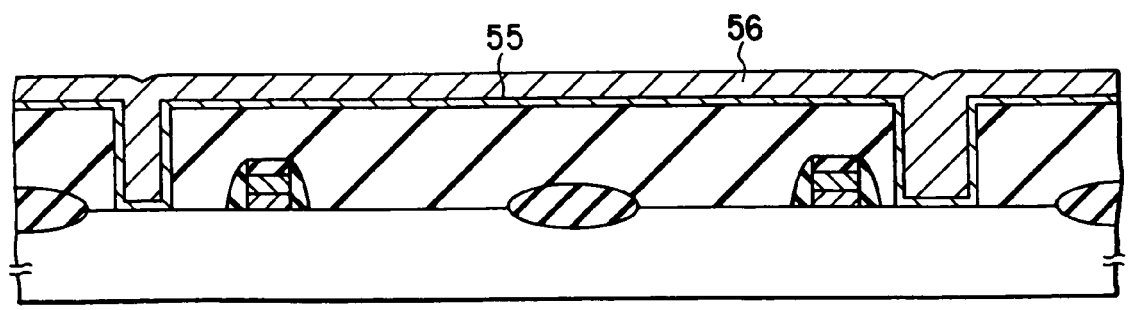
F I G. 8D

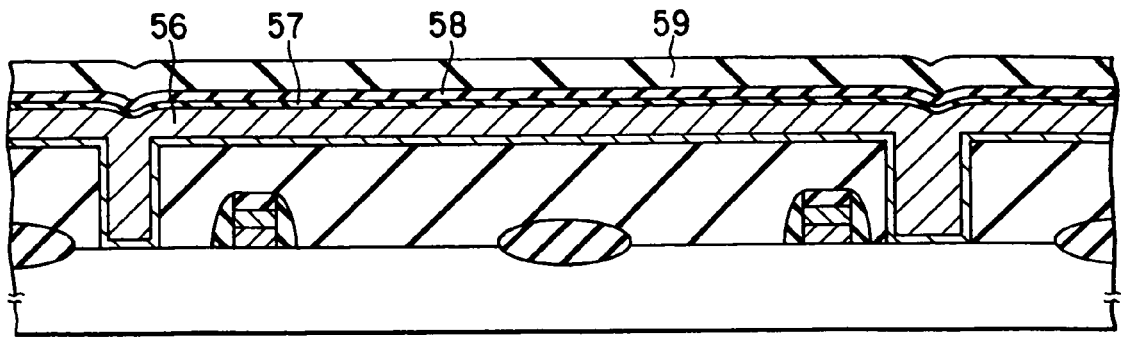
F I G. 8E
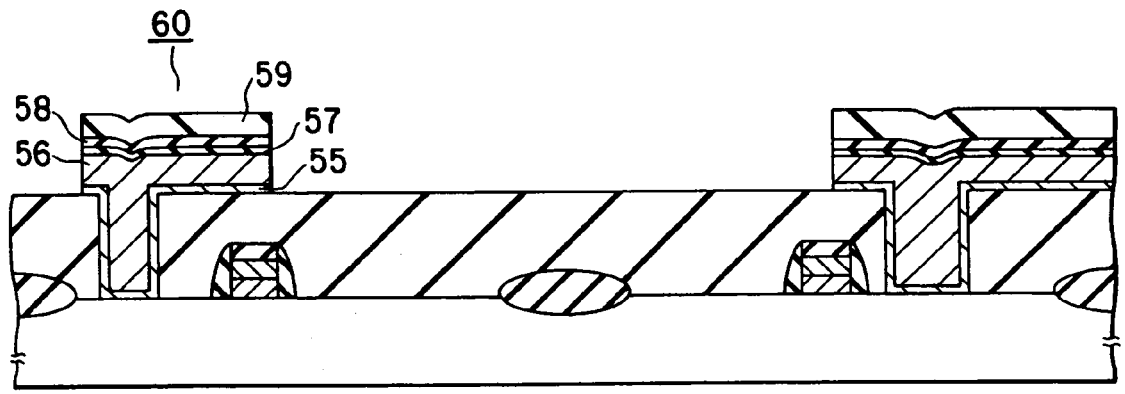
F I G. 8F
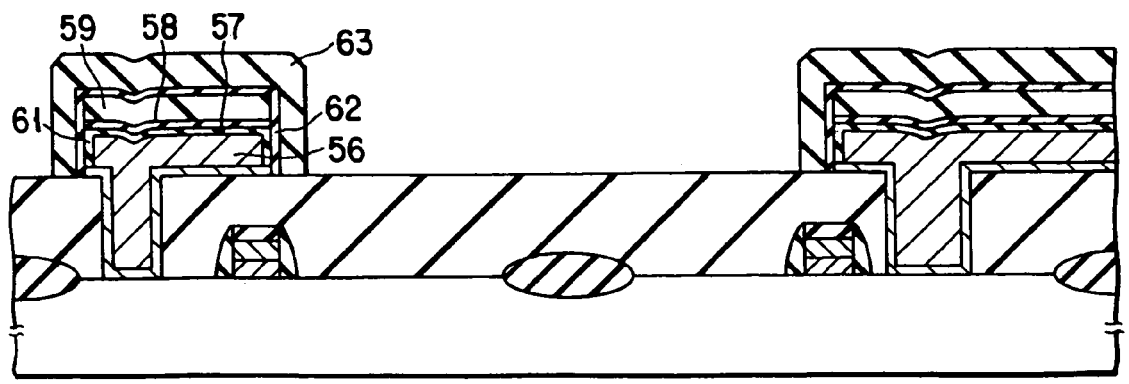
F I G. 8G

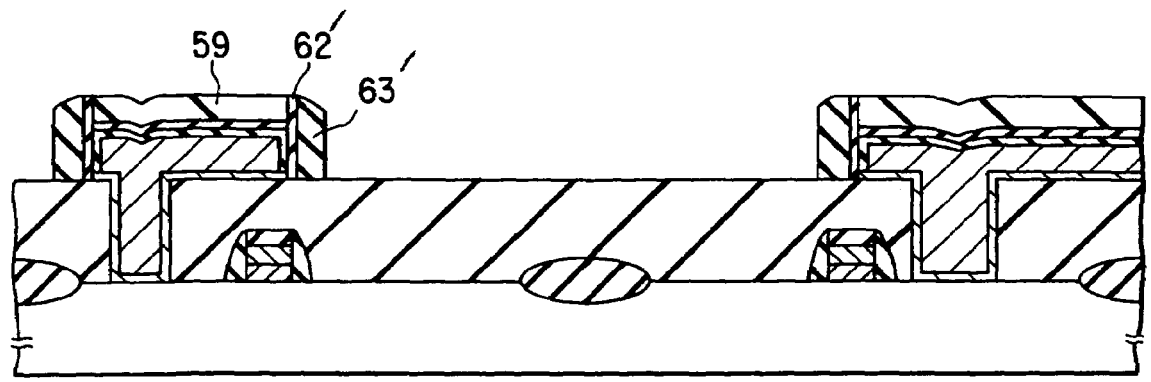
F I G. 8H
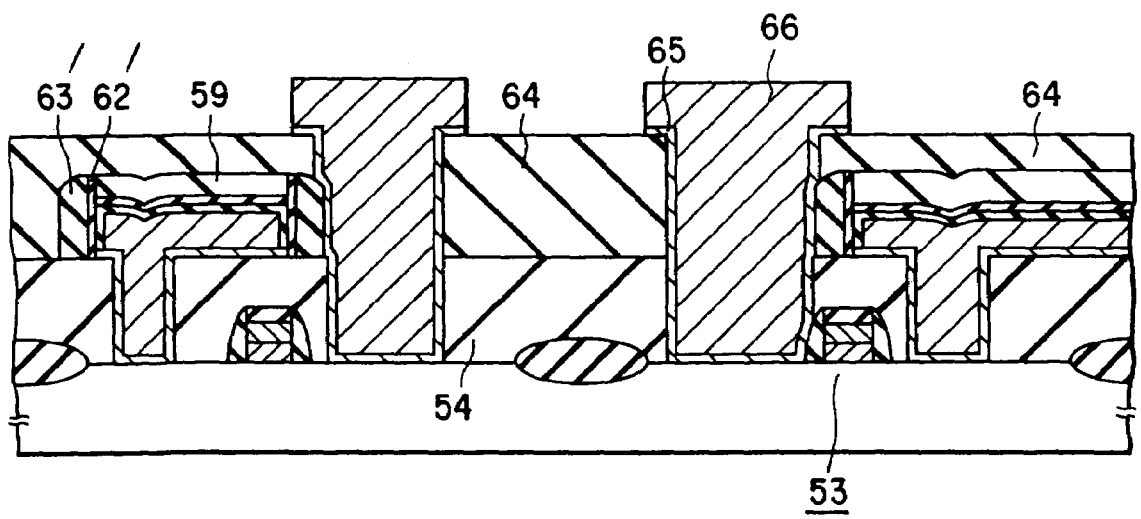
F I G. 9

SEMICONDUCTOR DEVICE AND MANUFACTURING METHOD THEREFOR

This is a divisional application of U.S. patent application Ser. No. 09/708,043, filed Nov. 8, 2000 now U.S. Pat. No. 6,893,980, which is a divisional application of U.S. patent application Ser. No. 08/982,416, filed Dec. 2, 1997 (now U.S. Pat. No. 6,162,741, issued Dec. 19, 2000), all of which are incorporated herein by reference.

BACKGROUND OF THE INVENTION

This invention relates to a semiconductor device and the manufacturing method therefor, particularly to the semiconductor device related to the constitution and the formation of the wiring used in an integrated circuit and the manufacturing method therefor.

In recent years, an integrated circuit rapidly increases in integration density and the operating speed. In order to increase the operating speed of the MOS FET used as an active element in an integrated circuit, it is notably important to reduce the resistance of the gate wiring (including a gate electrode).

According to one of the methods for reducing the gate wiring resistance, a gate is formed of silicide of refractory metal such as Mo and W, or the silicide stacked on a polysilicon layer, instead of polysilicon. The silicide of refractory metal is stable for the heat treatment at a high temperature and has resistivity to chemicals. In addition, the refractory metal silicide has high compatibility with the process using the polysilicon.

When the metal silicide is used to form the gate wiring, however, the wiring has a sheet resistance of no less than $10\Omega$/square even if the gate electrode is formed as high as 300–400 nm. If the height of the gate electrode increases to decrease the sheet resistance, however, various problems occur: a critical dimension loss will be increased when the etching step is performed, or the etching selectivity between the gate oxide film and the material of the gate electrode is not so large that the etching cannot be stopped at the gate oxide film and a silicon substrate of the device may be also etched.

The gate electrode and wiring may be formed of metal in order to obtain the gate wiring having, for example, the sheet resistance of $1\Omega$/square, and height lower than 400 nm so as to increase the transmission speed. The metal gate wiring, however, is not so stable to the heat treatment at a high temperature or not so good at the resistance to chemicals as metal silicide, and thus has merely low compatibility with the process using the polysilicon.

When metal is used to form the gate wiring, the top and the side of the gate electrode may be covered with a protection film in order to compensate the low resistance to heat and chemicals. It is essential for the protection film to have not only high heat resistance and high chemical resistance, but also to secure high insulation from the source and drain regions.

A silicon nitride film is thought to be one of the most suitable protection films in consideration of the barrier function during the oxidation process at a high temperature or the stabilization against the chemicals containing hydrofluoric acid. The silicon nitride film may be deposited in the plasma CVD or low pressure CVD process. In general, the protection film deposited in the low pressure CVD process is formed to be dense and contains smaller amount of hydrogen in comparing with the film deposited in the plasma CVD process. While, as will be described later, the low pressure CVD process needs to be performed at a temperature as high as 650–800° C. to obtain the film having enough thickness.

The metal used for the gate wiring will be considered next. W, one of the metals used for forming the gate wiring, is easily oxidized in an atmosphere having a low oxide concentration to turn into $WO_3$. Accordingly, in order to form a silicon nitride film as a protection film on the silicon wafer on which a W film is formed, the atmosphere in the chamber needs to be strictly controlled to maintain the oxide concentration at a low level not to oxidize the surface of the W film during a period of time from the introducing of the wafer into a reaction chamber to the time when the chamber temperature rises up to the level suitable for the process, since the low pressure CVD process needs to be performed at a high temperature of 650–800° C. to obtain a silicon nitride film, as described above.

The phase transition from orthorhombic to tetragonal occurs in the tungsten oxide film formed prior to the deposition of the SiN film at near 750° C. In this time, the surface roughness of the tungsten oxide film will be grown. When the surface roughness is grown, the surface of the gate cannot be smooth even if the protection film is formed on the gate electrode. On such an uneven surface, the formation of a fine pattern or the etching by the photolithography cannot be easily performed, and the wiring cannot be formed in a desired shape.

BRIEF SUMMARY OF THE INVENTION

The object of the present invention is to provide a semiconductor device and the manufacturing method therefor, wherein the deterioration of the surface condition of a metal film can be prevented.

According to the first aspect of the present invention, the manufacturing method of the semiconductor device, comprises the steps of: forming an oxide film on a metal film formed on a main surface of a semiconductor substrate by exposing the metal film to the oxidizing gas; reducing the oxide film formed on the surface of the metal film in a reducing atmosphere; and forming a protection film on the surface of the metal film reduced in the reducing step.

The metal film is preferably a tungsten film.

The protection film is preferably a silicon nitride film.

The above-mentioned manufacturing method can further comprise a step of forming a gate insulating film on the semiconductor substrate prior to the step of forming the oxide film on the metal film and a step of forming on the gate insulating film a wiring film for forming a gate wiring. The wiring film include at least the metal film. The step of forming the oxide film on the metal film can include a step of forming an oxide film on the wiring film for the gate wiring.

The manufacturing method can still further comprise a step of forming a gate wiring by patterning the wiring film between the step of forming the wiring film for the gate wiring and the step of oxidizing the metal film. The step of forming an oxide film on the metal film can include the step of forming the oxide film on the gate wiring.

According to the above-mentioned manufacturing method, the protection film is formed after the oxide film formed on the surface of the metal film is reduced, and thus the protection film can be formed without damaging the surface of the metal film.

The metal film may be a tungsten film, for example. When the tungsten is used to form the metal film, the cracks of the tungsten film due to the rapid expansion caused by the oxidation performed in the oxidization step, can be prevented by performing the step of exposing the metal film to the oxidizing gas at a temperature below 550° C. Similarly, by performing the step of reducing the oxide film in the reducing atmosphere at a temperature below 750° C., the growth of the surface roughness due to the change of the crystalline structure.

Further, the above metal film can be normally used as a part of the metal film for forming the gate wiring. In this case, for example, the metal film for forming the gate wiring is comprised of a silicon film, a passivation film for preventing the reaction on the silicon film, and a tungsten film on the passivation film.

The reducing atmosphere can comprise at least one selected from a group of ammonia, dichrolsilane, silane, and hydrogen.

According to the second aspect of the present invention, the manufacturing method of the semiconductor device, comprises the steps of: forming at least a silicon film and a metal film on a main surface of a semiconductor substrate; and selectively forming an oxide film on the silicon film by processing a semiconductor substrate on which the silicon film and the metal film are formed in an atmosphere containing a gas in which only the silicon film is oxidized and the metal film is free from being oxidized.

The metal film is preferably a tungsten film.

The above-mentioned manufacturing method can further comprises a step of forming an oxide film on the metal film by exposing the metal film to an oxidizing gas, and a step of reducing the oxide film formed on the surface of the metal film in a reducing atmosphere, between the step of forming the silicon film and the metal film and the step of forming the oxide film on the silicon film.

The step of forming the silicon film and the metal film includes a step of forming a stacked-layer film for forming a gate wiring by stacking at least a silicon film and a metal film on the silicon film on the gate oxide film on the semiconductor substrate.

The step of selectively forming the oxide film on the surface of the silicon film can include a step of forming another oxide film on the surface of the semiconductor substrate.

The step of forming the silicon film and the metal film includes steps of: forming an oxide film on the surface of the semiconductor substrate; forming a stacked-layer film for forming a gate wiring by stacking at least a silicon film and a metal film above the silicon film on the gate oxide film on the semiconductor substrate; and forming a gate wiring by patterning the stacked-layer film.

The step of forming the oxide film on the metal film can include a step of forming the oxide film on the surface of the gate wiring.

According to the above-mentioned manufacturing method, the oxide film is not formed on the surface of the metal film, but formed selectively on the surface of the silicon film. The surface of the metal film is therefore prevented from being made rough during the step of forming the oxide film on the metal film. When the method is used for a gate wiring formation, the concentration of the electric field on the side portion of the gate electrode can be relaxed by the oxide films formed selectively on the surface of the silicon film and the surface of the semiconductor substrate, with a result that a semiconductor device with high reliability can be attained.

When the metal film is a tungsten film and the stacked-layer film is formed on the silicon film, a reaction prevention film is desired to be formed in a position between the silicon film and the tungsten film.

The atmosphere containing the gas oxidizing only the silicon film and hot oxidizing the metal film can be composed of water vapor and hydrogen, for example. In this case, the water vapor functions as the oxidizing gas, and the hydrogen gas functions as the reducing atmosphere.

The atmosphere containing the gas oxidizing only the silicon film and not oxidizing the metal film can comprise CO and $CO_2$, for example. In this case, $CO_2$ functions as the oxidizing gas, and CO functions as the reducing atmosphere.

According to the third aspect of the present invention, the manufacturing method of the semiconductor device, comprises the steps of: forming an oxide film on a metal film formed on a main surface of a semiconductor substrate by exposing the metal film to an oxidizing gas; forming a first protection film on the oxide film on the surface of the metal film at a temperature lower than a temperature at which a phase transition of the oxide film of a metal constituting the metal film occurs; and heating a semiconductor substrate on which the first protection film is formed, at a temperature higher than the temperature at which the phase transition of the oxide film of the metal constituting the metal film occurs.

The metal film is preferably a tungsten film.

The first protection film is preferably a silicon nitride film.

In the above-mentioned manufacturing method, the step of heating the semiconductor substrate on which the first protection film is formed, at a temperature higher than the temperature at which the phase transition of the oxide film of the metal constituting the metal film occurs, can include a step of forming a second protection film at a temperature higher than the temperature at which the phase transition of the oxide film of the metal constituting the metal film on the first protection film occurs.

The above-mentioned manufacturing method can further comprise, prior to the step of forming the oxide film, the steps of: forming a gate insulating film on the semiconductor substrate and forming on the gate insulating film a wiring film for forming a gate wiring. The wiring film include at least the metal film. The step of forming the oxide film on the metal film can include a step of forming the oxide film on the wiring film.

The manufacturing method can still further comprise between the step of forming the wiring film for the gate wiring and the step of forming the oxide film, a step of forming a gate wiring by patterning the wiring film.

The manufacturing method can further comprise prior to the step of forming the oxide film, a step of forming a wiring film for constituting a wiring other than the gate wiring. The wiring film has at least a metal film. The step of forming the oxide film on the metal film can include a step of forming the oxide film on the wiring film.

The manufacturing method can still further comprise between the step of forming the wiring film for constituting a wiring other than the gate wiring and the step of forming the oxide film, a step of forming the wiring other than the gate wiring by patterning the wiring film for the wiring other than the gate wiring.

According to the above-mentioned manufacturing method, the metal film is protected by the first protection film formed at the temperature lower than the temperature at which the phase transition of the oxide film of the metal constituting the metal film occurs, and thus the surface of the metal film can be prevented from being damaged even if the second protection film is formed thereafter at the temperature higher than the temperature at which the phase transition of the oxide film of the metal constituting the metal film occurs. In addition, a metal oxide film (e.g., a tungsten oxide film) formed on the metal film improves the chemical resistance of the device.

When the tungsten is used as the metal film, for example, the first protection film is formed at the temperature lower than 750° C. since the phase transition of the tungsten oxide film formed on the tungsten film occurs around 750° C., and the second protection film is formed at the temperature higher than 750° C.

The metal film constitutes at least a part of the film for constituting the gate wiring or constituting the wiring other than the gate wiring, for example. When the metal film is used as a part of the film for the gate wiring, the gate wiring is desired to be constituted of a silicon film, a passivation film for preventing the reaction on the silicon film, and a tungsten film on the passivation film.

A film such as a silicon nitride film, for example, is employed as the first protection film. The silicon nitride film is formed in accordance with the low pressure CVD or the plasma CVD. The silicon nitride film is also preferable as the second protection film.

According to the fourth aspect of the present invention, the semiconductor device comprises: a tungsten film formed on a main surface of a semiconductor substrate; a tungsten oxide film formed on the surface of the tungsten film; and a protection film formed on the tungsten oxide film. The tungsten oxide film is preferably to have the thickness smaller than 10 nm.

According to this structure, the tungsten oxide film formed on the tungsten film improves the chemical resistance of the device, and the protection film formed on the tungsten oxide film prevents the damage of the surface of the tungsten oxide film.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 2 is a view more specifically showing a part of the steps of the manufacturing method according to the first embodiment of the present invention;

FIGS. 4A–4E are sectional views of the semiconductor device according to the manufacturing method of the second embodiment of the present invention, for showing the steps of the manufacturing method;

FIG. 5 is a view more specifically showing a part of the steps of the manufacturing method according to the second embodiment of the present invention;

FIGS. 8A–8H are sectional views of the semiconductor device according to the fourth embodiment of the present invention, for showing the steps of the manufacturing method; and FIG. 9 is a view showing an example in which the fourth embodiment of the present invention is applied to a multi-layered wiring device.

DETAILED DESCRIPTION OF THE INVENTION

The embodiment of the present invention will be described below with reference to the drawings.

[The First Embodiment]

The semiconductor device according to the first embodiment of the present invention will be described at first with reference to FIGS. 1A–1E.

Figure 1A:
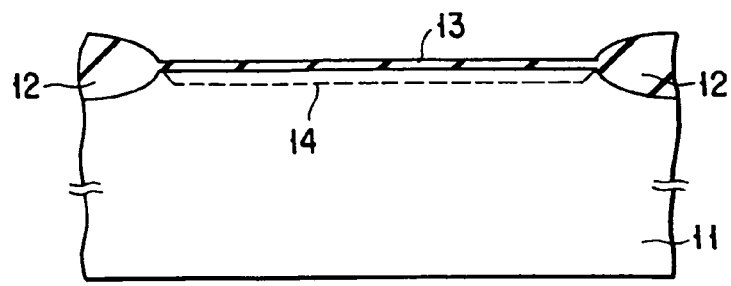
FIGS. 1A–1E are sectional views of the semiconductor device according to the manufacturing method of the first embodiment of the present invention, for showing the steps of the manufacturing method.

Firstly, an isolation oxide film 12 having a thickness around 600 nm and an oxide film 13 are formed on a p-type silicon substrate 11 in the thermal oxidation process. Subsequently, impurity is implanted into the device to form an impurity layer 14 in order to adjust the threshold voltages of the transistors to be formed later, in case of need (FIG. 1A).

Next, the oxide-film 13 is removed with use of diluted hydrofluoric acid or the like, and then a gate oxide film 15 having a thickness of 5 nm is newly formed in the thermal oxidation process. The oxide film 13 is removed because of the defects therein which are formed during the ion-implantation process, and is used to purify the surface of the substrate as a sacrificial oxide. The gate oxide film 15 is formed in order to obtain a gate oxide film with high reliability.

Figure 1B:
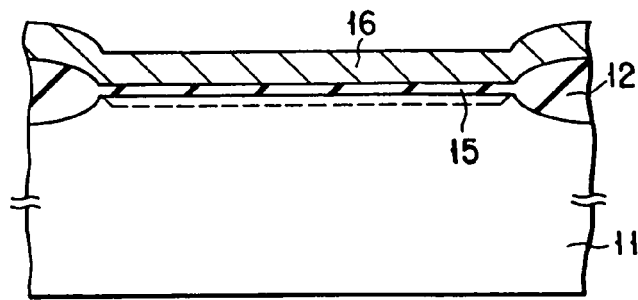

Then, a polysilicon film having a thickness around 100 nm is formed in the low pressure CVD process. The polysilicon film is doped with As accelerated to 40 KeV in an ion implantation process in dose of $3 \times 10^{15}/cm^2$, thereby a polysilicon film 16 doped with n-type impurity is obtained. By stacking a refractory metal film described later on the polysilicon film 16 formed in such a manner, various conventional methods of controlling the threshold voltages used in a polysilicon single gate or polycide gate can be employed as well (FIG. 1B).

Figure 1C:
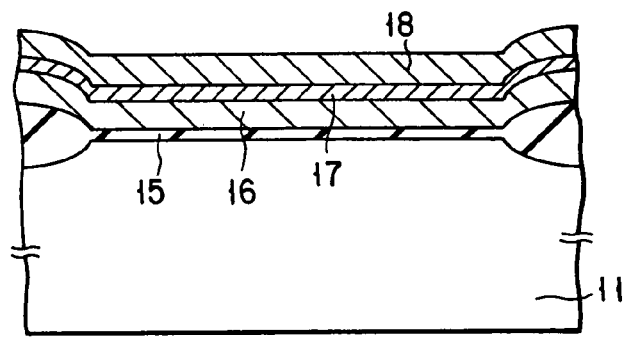

Next, a tungsten nitride ($WN_X$) film 17 having a thickness around 5 nm is formed in a reactive sputtering process, and a tungsten film 18 having a thickness around 100 nm is formed in the sputtering process (FIG. 1C).

Figure 1D:
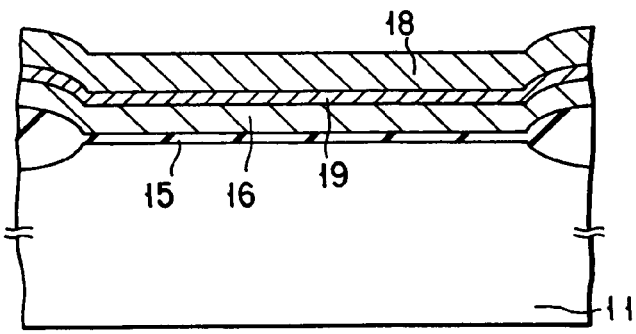

The $WN_X$ film 17 is decomposed in heat treatments such as an annealing process and an SiN deposition process performed later. A part of the nitrogen included in the $WN_X$ film is redistributed in the interface between the polysilicon film 16 and the $WN_X$ film 17, to form an amorphous layer 19 having a thickness below 1 nm and containing W, Si, and N. The amorphous layer suppresses the distribution of W into the polysilicon layer, thereby the gate oxide film is prevented from being damaged. More specifically, the amorphous layer 19 functions as a barrier layer. The $WN_X$ film 17 from which nitrogen is eliminated is integrated with the W film 18 (FIG. 1D).

Figure 1E:
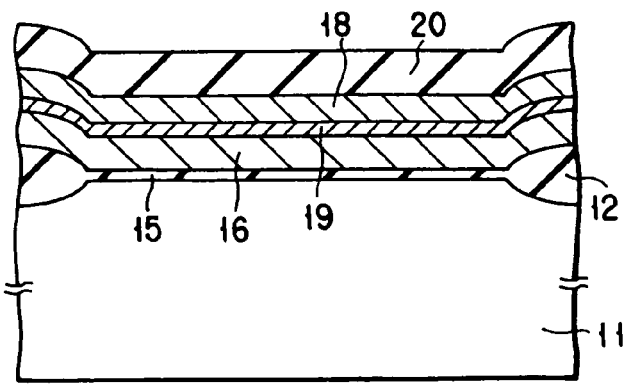

A silicon nitride film 20 as a protection film, which has a thickness around 100 nm, is deposited on the W film in accordance with the low pressure CVD (FIG. 1E). This process will be described below in detail with reference to the FIG. 2.

Figure 3:
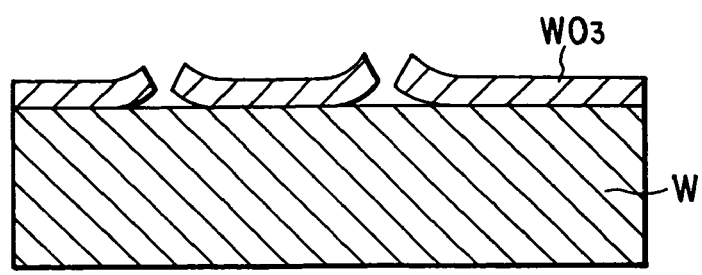
FIG. 3 is a view showing the condition when the semiconductor device having the tungsten film is rapidly oxidized at the temperature higher than a predetermined temperature.

At first, the silicon wafer on which W film and the like are formed is introduced into a reaction tube. In this time, tungsten oxide such as $WO_3$ is formed on the W film due to the oxygen introduced together with the wafer (step 1). When the W film is oxidized to form $WO_3$, the film increases in volume about three times. Particularly, when the wafer is introduced into the reaction tube at a temperature higher than 550° C., the volume of the film-rapidly increases. In such a condition, the cracks may occur in the surface of the $WO_3$ film in the oxidation process, as shown in FIG. 3. On such a film, a smooth surface can never be attained again even if the $WO_3$ is reduced thereafter. It is thus important to introduce the silicon wafer into the reaction tube below 550° C. It is also important for preventing the progress of the oxidation to decrease the partial pressure of the oxygen in the reaction tube possibly soon after introducing the wafer into the reaction tube. Accordingly, in this process, the atmosphere in the reaction tube is exhausted to decrease the pressure in the tube below 1 m Torr after introducing the wafer into the reaction tube before the temperature is raised (step 2).

Subsequently, the temperature is raised in the nitrogen atmosphere (step 3), and reducing atmosphere is introduced into the reaction tube at a temperature lower than 750° C. (700° C. in the present embodiment) to reduce the $WO_3$ formed on the W film (step 4). Such gases used for deposition of SiN, as ammonia, dichlrorsilane ($SiH_2Cl_2$) and silane ($SiH_4$), or $H_2$ gas, are suitable for the reduction. The reason why the reduction process is performed at a temperature lower than 750° C. is that the crystalline structure of $WO_3$ is changed around 750° C. to form roughness on the surface, and a smooth surface can never be attained again even if the $WO_3$ is reduced thereafter.

In the embodiment shown in FIG. 2, the temperature raising and the reduction processes are divided into the steps 3 and 4, but can be simultaneously performed in the same step if the reduction has finished before the temperature reaches 750° C.

Next, the temperature is raised in a nitrogen atmosphere to reach a temperature (780° C. in the present embodiment) for depositing a SiN film (step 5), so that the temperature of an entire surface of the wafer becomes uniform (step 6: heat recovery). $NH_3$ and $SiH_2Cl_2$ gases are introduced into the reaction tube to deposit SiN on the wafer (step 7).

Then, the process gases are completely exhausted and the temperature of the reaction tube is brought down to the load-out temperature (step 8, step 9), and nitrogen gas is introduced into the reaction tube to recover the pressure to the normal pressure in the tube, and then the wafer is taken out from the reaction tube (step 10).

In this manner, a silicon nitride film 20 is formed on the stack-layer for constituting the gate wiring, comprising the polysilicon film 16, the amorphous layer 19, and the tungsten film 18. Thereafter, a gate electrode is formed by performing the patterning to attain a desired shape in the conventional process. With use of the gate electrode as a mask, impurity is doped into the substrate to form source and drain regions. The processes of depositing a $SiO_2$ film in accordance with the CVD; forming of contact holes; and forming of an Al wiring are followed thereto, and then a finished MOS FET is obtained.

The Second Embodiment

The semiconductor device according to the second embodiment of the present invention will be described below with reference to FIGS. 4A–4E. The same steps as in the first embodiment can be also employed in a part of this embodiment, and thus the same reference numerals denote the elements corresponding to the elements shown in FIGS. 1A–1E.

For example, the process wherein the element isolation oxide film 12; the gate oxide film 15; polysilicon film 16; and the amorphous layer as the passivation film 19; the tungsten film 18 and a silicon nitride film as the protection film 20 are formed on the silicon substrate 11, and then the SiN/W/WSiN/polycrystalline Si is patterned in a desired shape to form a gate electrode, may be employed also in this embodiment, in accordance with the method described in the first embodiment.

In addition to the SiN film according to the method described in the first embodiment, an $SiO_2$ film formed in accordance with the low temperature deposition method such as atmospheric pressure CVD or the plasma CVD may be used as the protection film 20. In addition, the other insulating film or the conductive film, which has sufficient resistance to heat and chemicals may be employed as the protection film 20, in view of the subsequent steps (FIG. 4A).

Figure 4A:
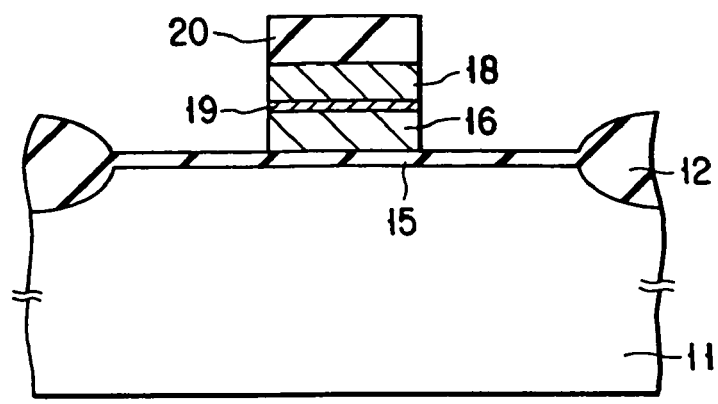
Figure 4B:
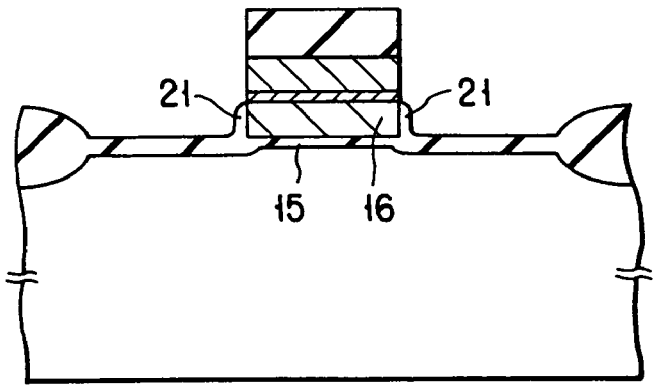

Subsequently, a heat treatment is performed in the atmosphere containing $H_2/N_2/H_2O$. In the heat treatment, the W film 18 and the passivation film 19 are not oxidized, and only the polysilicon film 16 and the silicon substrate 11 are selectively oxidized to form an oxide film 21. The oxide film 21 is formed to increase the thickness of the gate oxide film at the both ends, thereby relax the electric field concentration at the ends of the gate electrode (FIG. 4B). The following is more detailed description of the above-mentioned steps, with reference to FIG. 5:

At first, the wafer having the structure shown in FIG. 4A is introduced into the reaction tube. In this time, tungsten oxide such as $WO_3$ is formed on the side face of the W film 18 constituting the gate electrode due to the oxygen introduced together with the wafer. The phenomena such as the increase of the film in volume and the like are the same as described in the first embodiment (step 1). Subsequently, the reaction tube is evacuated below 1 m Torr before raising the temperature of the tube, in order to eliminate the oxidizing species (step 2).

Next, the temperature of the reaction tube is raised in nitrogen atmosphere (step 3), and the $WO_3$ formed on the side surface is reduced by a reducing atmosphere (e.g. $H_2$ gas) introduced into the reaction reason for performing this step at a temperature lower than 750° C. has been described in the first embodiment. In the example shown in FIG. 5 the temperature raising and the reduction processes are divided into the steps 3 and 4, but can be simultaneously performed in the same step if the reduction has finished before the temperature reaches 750° C., similarly to the first embodiment.

The hydrogen gas is introduced together with nitrogen gas such that the partial pressure of hydrogen is set less than 4% volume: the explosion limit of the hydrogen. The atmosphere can be thus treated as the normal noncombustible gas, and the process can be performed safely with use of a low-cost processing apparatus. Similarly, the pressure of the atmosphere is maintained a little lower than an atmospheric pressure, the reaction chamber can be prevented from bursting, even if the hydrogen gas burns.

Subsequently, the temperature is raised in the nitrogen atmosphere (step 5), so that the temperature of an entire surface of the wafer is set uniform at the temperature for oxidizing silicon, i.e., 800° C. (step 6). Then $H_2O$ gas and $H_2$ gas are introduced into the reaction tube. When the oxidation process is performed while the rate of (the partial pressure of $H_2O$ gas)/(the partial pressure of $H_2$) is controlled to be maintained at a predetermined value, only Si is oxidized without oxidizing W. According to the thermodynamic calculation, the selective oxidation of silicon occurs under when the above-mentioned partial pressure rate is lower than 0.37. Also in this step, the combustion of the hydrogen is prevented by adding nitrogen to the atmosphere, and the process can be performed safely (step 7), as the above-mentioned step.

Then, the process gases are completely exhausted and the temperature of the reaction tube is brought down to the load-out temperature (step 8, step 9), and nitrogen gas is introduced into the reaction tube to set the pressure in the tube at the atmospheric pressure again, and then the wafer is taken out from the reaction tube (step 10).

Figure 4C:
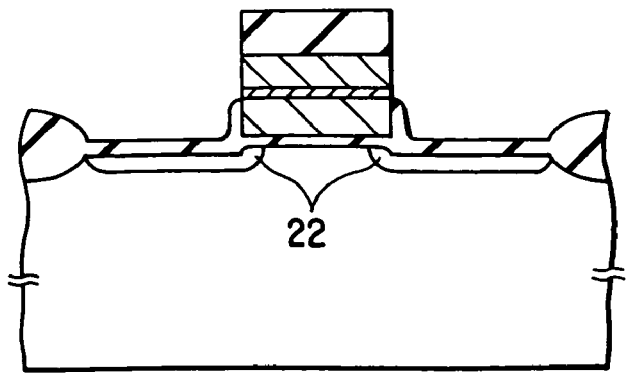

Next, with use of the gate electrode as a mask, ions of As accelerated to 20 keV are implanted in dose of $1\times10^{14}/cm^2$ to form a LDD (Lightly Doped Drain) region 22 to suppress the concentration of the electric field at the end of the drain region (FIG. 4C).

Next, a silicon nitride film 23 is deposited in accordance with the CVD. The silicon nitride film 23 is formed to form a gate sidewall insulator of the LDD region, and simultaneously functions as a protection film of the gate side surfaces.

The step of forming the silicon nitride film 23 can be performed in the order shown in FIG. 2, similarly to the first embodiment: the $WO_3$ film formed when the wafer is introduced into the reaction tube is reduced in the reducing atmosphere such as $NH_3$ gas, then the temperature is raised to 780° C. and $SiH_2Cl_2$ gas and $NH_3$ gas are introduced into the reaction tube to form a SiN film 23. In this manner, the SiN film 23 can be deposited while the surface of the W film is maintained to be smooth (FIG. 4E).

The SiN film 23 is etched back in accordance with the RIE to form a gate sidewall insulator 23a. With use of the gate electrode and the gate sidewall insulator as a mask, As ion implantation with a voltage accelerated to 20 keV is performed in dose of $1\times10^{14}/cm^2$ to form source and drain regions 24 (FIG. 4E). Thereafter, the processes of depositing an $SiO_2$ film in accordance with the CVD; forming of contact holes; and forming of an Al wiring are followed thereto, and then a finished MOS FET is obtained.

The Third Embodiment

The semiconductor device according to the third embodiment of the present invention will be described with reference to FIGS. 6A–6J.

Figure 6A:
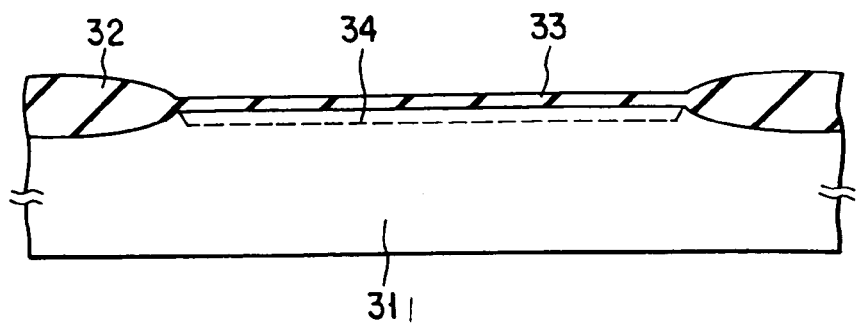
FIGS. 6A–6J are sectional views of the semiconductor device according to the manufacturing method of the third embodiment of the present invention, for showing the steps of the manufacturing method.

An isolation oxide film 32 having a thickness around 600 nm and an oxide film 33 are formed on a p-type silicon substrate 31 in the thermal oxidation process. Subsequently, impurity is implanted into the device to form an impurity layer 34 in order to adjust the threshold voltages of the transistors to be formed later, in necessity (FIG. 6A).

Figure 6B:
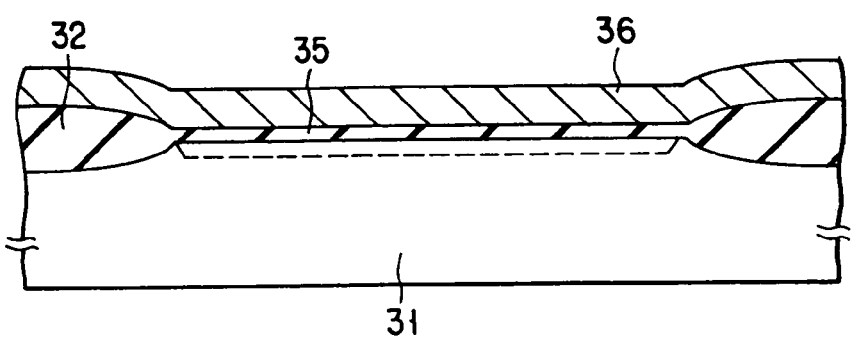

Next, the oxide film 33 is removed with use of diluted hydrofluoric acid or the like, and then a gate oxide film 35 having a thickness around 5 nm is formed. The oxide film 33 is removed because of the defects therein, which are formed during the ion-implantation process, and is used to purify the surface of the substrate as a sacrificial oxide. The gate oxide film 35 is newly formed in order to obtain a gate oxide film with high reliability. A polysilicon film having a thickness around 100 nm is then formed in the low pressure CVD process. The polysilicon film is doped with As ions accelerating to 40 KeV in an ion implantation process in dose of $3\times10^{15}/cm^2$ to form the polysilicon film 36 doped with n-type impurity. By stacking a refractory metal film described later on the polysilicon film 36 formed in such a manner, various conventional methods which have been performed to control the threshold voltages of a polysilicon single gate or polycide gate can be employed (FIG. 6B).

Figure 6C:
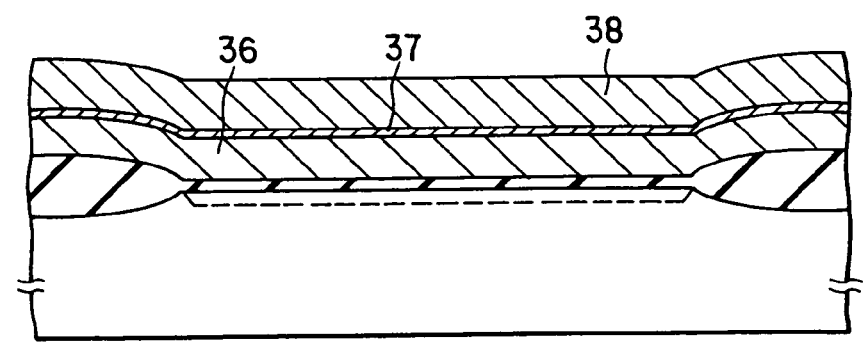

Next, a tungsten nitride ($WN_x$) film 37 having a thickness around 5 nm is formed in a reactive sputtering process, and a tungsten film 38 having a thickness around 100 nm is formed in a sputtering process (FIG. 6C).

Figure 6D:
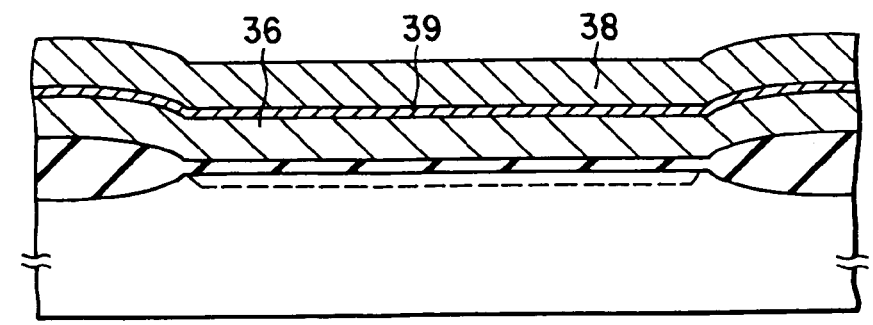

The $WN_x$ film 37 is decomposed during in heat treatments such as an annealing process and an SiN deposition process performed later. A part of the nitrogen included in the $WN_x$ film is re-distributed in the interface between the polysilicon film 36 and the $WN_x$ film 37, to form an amorphous layer 39 having a thickness below 1 nm and containing W, Si, and N. The amorphous layer suppresses the distribution of W into the polysilicon layer, thereby the gate oxide film is prevented from being damaged. The WNx film 37 from which nitrogen is eliminated is integrated with the W film 38 (FIG. 6D).

Figure 6E:
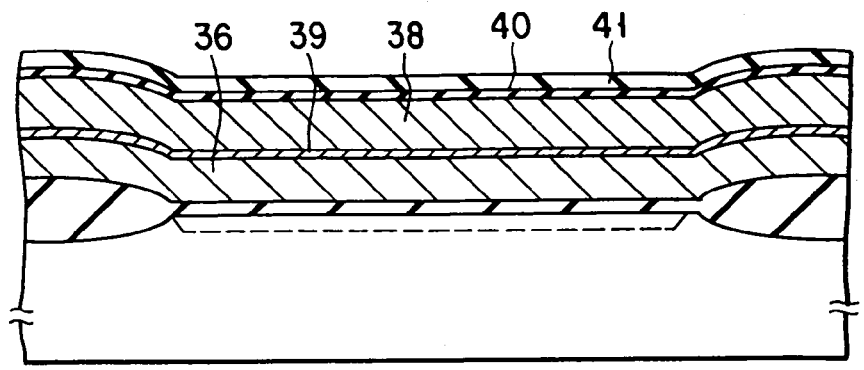

A silicon nitride film 41 as the first protection film having a thickness around 10 nm is deposited on the W film 38 at 700° C. in accordance with the low pressure CVD. In this time, a thin $WO_3$ film 40 is formed on the surface of the W film since the W film is oxidized in the loading-in. The $WO_3$ film 40 functions as a protection film for preventing the W film from being dissolved by chemicals if the surface of the $WO_3$ film can be formed to be uniform. The $WO_3$ film 40 also functions as adhesive for intensifying the adhesion between the W film 38 and the SiN film 41. The $WO_3$ film, however, increases in volume about three times of the W film when the $WO_3$ film is formed, thereby inner stress will be generated. The upper limit of the thickness of the $WO_3$ film therefore should be determined in consideration of the stress caused by the $WO_3$ film and the upper film stacked thereon. In addition, the $WO_3$ film has higher electric resistance than that of the W film, and thus the electric resistance will increase when the thickness of the $WO_3$ film is larger than that of the W film. In consideration of the above, the upper limit of the thickness of the $WO_3$ film is preferably lower than 10 nm (FIG. 6E).

Figure 6F:
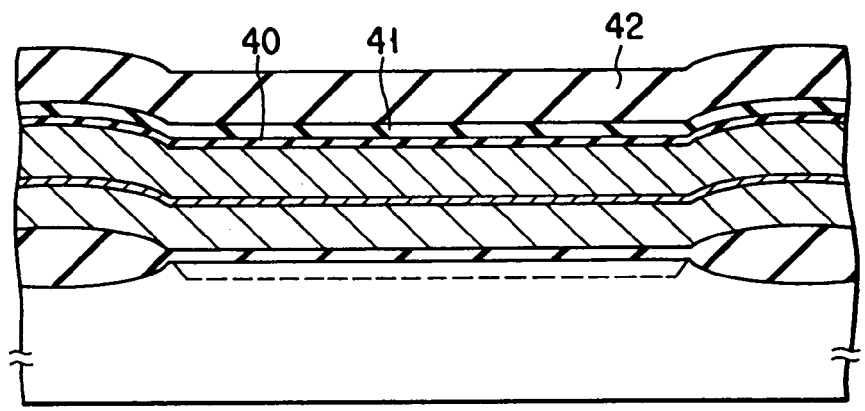
Figure 6G:
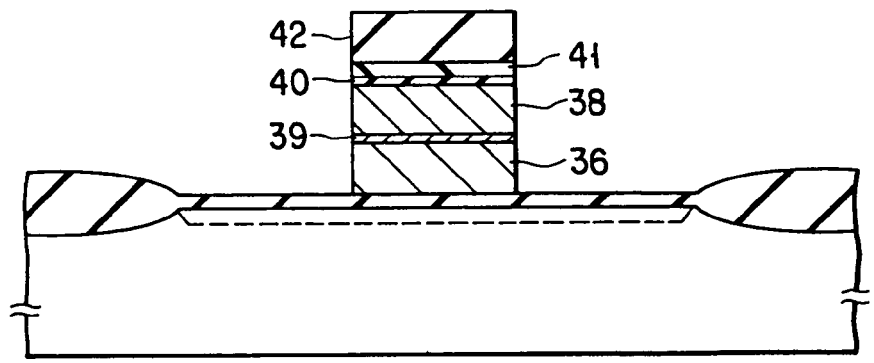

Subsequently, a silicon nitride film 42 as the second protection film, which has a thickness around 100 nm, is deposited at 780° C. in accordance with the low pressure CVD (FIG. 6F). The deposition process of the silicon nitride film 42 will be described below in detail with reference to FIG. 7.

At first, the wafer with the W film deposited thereon is introduced in the reaction tube. Due to the oxygen introduced together with the wafer, a tungsten oxide film 40 such as a $WO_3$ film is formed on the W film (step 1).

When the W is oxidized to form $WO_3$, the film increases in volume about three times. Particularly, when the wafer is introduced into the reaction tube at a temperature higher than 550° C., the volume of the film rapidly increases. Accordingly, the cracks may occur in the surface of the $WO_3$ film in the oxidation process, as shown in FIG. 3. In such a case, a smooth surface can never be attained again even if the $WO_3$ is reduced thereafter. It is thus important to introduce the silicon wafer into the reaction tube below 550° C.

In the case where the surface of the W film 38 is exposed to the oxidizing gas before the wafer is introduced into the reaction tube, the $WO_3$ film has been formed when the wafer is introduced into the reaction tube. For example, in the photoresist-removing process by the ashing with use of $O_2$ plasma or the like, the $WO_3$ film has been formed on the W film. It is important for preventing the progress of the oxidation to decrease the partial pressure of the oxygen in the reaction tube possibly soon after introducing the wafer into the reaction tube. In order to decrease the partial pressure of oxygen, the reaction tube is evacuated before the temperature of the wafer is raised after the wafer is introduced into the reaction tube (step 2).

The temperature of the reaction tube is then raised to the temperature (780° C., for example) for depositing the silicon nitride film 42. Before the temperature reaches 750° C., $SiH_2Cl_2$ gas and $NH_2$ gas are introduced into the reaction tube to deposit a thin silicon nitride film 41 for preventing the structural change of the surface of the film. The reason why the process is performed at the temperature below 750° C. is that the crystalline structure of $WO_3$ is changed around 750° C. to form roughness on the surface, and a smooth surface can never be attained again even if the $WO_3$ film is reduced thereafter. The thickness of the thin silicon nitride film 41 is preferably around 10 nm. However, the deposition rate is changed due to the process condition, and thus the thickness of the thin silicon nitride film 41 should be determined in accordance with the process condition (steps 3, 4, and 5).

After the silicon nitride film 41 is deposited on the surface of the W film 38 at a temperature below 750° C., the temperature of the reaction tube is raised to reach a temperature (780° C., for example) for depositing a SiN film to form the second protection film, so that the temperature of an entire surface of the wafer is uniform (steps 6 and 7).

After the temperature of an entire surface of the wafer is set uniform, $SiH_2Cl_2$ and $NH_3$ gases are introduced into the reaction tube to deposit a SiN film 42 having a thickness around 100 nm (step 8). The protection film is formed to be divided into the first and second protection films for the following reason:

The first protection film 41 is deposited at a relatively low temperature, and the deposition rate is low. Accordingly, the period of time required for the deposition of the protection film is remarkably long if the deposition is performed to attain the necessary film thickness in accordance with the deposition manner of the first protection film 41. In order to increase the deposition rate and to reduce the period of time required for the deposition, the short of the protection film thickness is compensated by forming the second protection film 42 to attain the desired film thickness after the first protection film 41 having the thickness enough to protect (maintain) the surface of the W film is formed. In short, the first protection film is formed to cover the W film 38 in order to prevent the smoothness of the surface of the W film 38 from being lost due to the change of the crystalline condition of the tungsten oxide such as $WO_3$ formed on the W film 38. The first protection film thereby maintains the smooth surface of the W film 38.

After the second protection film is deposited, the process gases are completely exhausted and the temperature of the reaction tube is brought down to the load-out temperature, and then the wafer is taken out from the reaction tube (step 9, step 10, and step 11).

The first protection film 41 may be formed of either a silicon nitride film deposited in the low pressure CVD process or a silicon nitride film deposited in the plasma CVD process. Generally, when the thick silicon nitride film is formed in the plasma CVD, the hydrogen contained in the film is eliminated during the heating process performed later. As a result, problems such as the enhancement of the diffusion of B (boron) in the polysilicon constituting a silicon substrate or a gate electrode, or the generation of blisters between the silicon nitride film and the lower film, may occur. In the silicon nitride film having a thickness around 10 nm, however, such problems will not occur even if the silicon nitride film is formed in the plasma CVD.

If the amount of hydrogen contained in the silicon nitride film is relatively small and no problem occurs even when the silicon nitride film is formed to be thicker than 100 nm during the silicon nitride film deposition process in accordance with the plasma CVD, the protection film deposition process does not always need to be divided into the two steps as described above, but the protection film can be formed in one deposition step. The deposition temperature in the plasma CVD process is set around 300–400° C., and thus the deposition rate is higher than that of the low pressure CVD process.

Thereafter, a heat treatment is performed in the atmosphere comprised of $H_2/N_2/H_2O$. In the heat treatment, the W film 38 and the passivation film 39 are not oxidized, and only the polysilicon film 36 and the silicon substrate 31 are selectively oxidized, to form an oxide film 43. The oxide film 43 is formed to increase the thickness of the gate oxide film at the both ends, thereby relax the concentration of the electric field at the ends of the gate electrode.

Figure 6H:
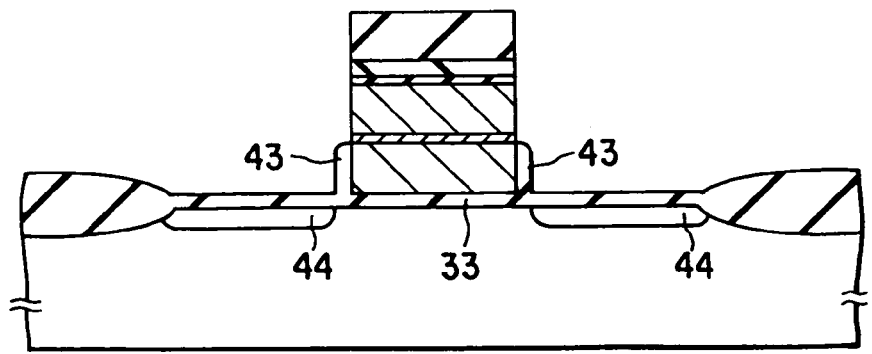

Next, As ions accelerated to 20 keV are doped in dose of $1 \times 10^{14}/cm^{-2}$ to form an LDD region 44 with use of a gate electrode as a mask to suppress the concentration of the electric field at the end of the drain region (FIG. 6H).

Figure 6I:
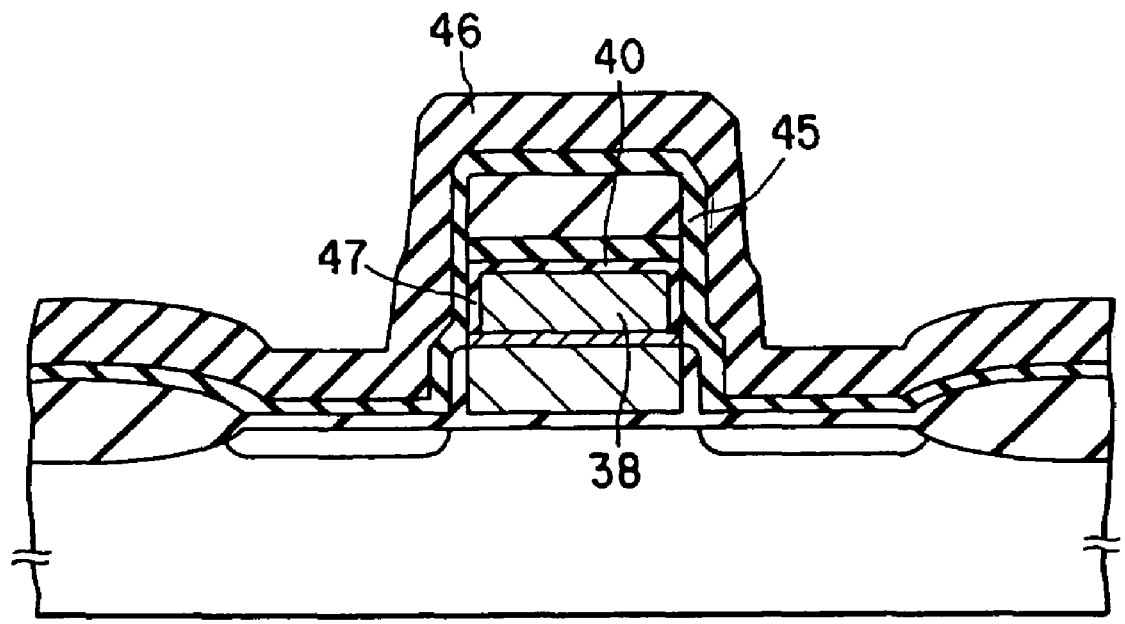

Subsequently, a protection film formed of SiN or the like is deposited in the low pressure process to form a gate sidewall insulator. Also in this case, the first protection film 45 formed of a silicon nitride film or the like is formed at a temperature lower than 750° C. (700° C. in the present embodiment) in accordance with the case shown in FIG. 7, and then the temperature is raised to 780° C., and the second protection film 46 formed of silicon nitride or the like and having a thickness around 100 nm is deposited. In this manner, the protection film is uniformly deposited in the same reaction tube while a tungsten oxide film 47 formed on the sidewall of the W film 38 is maintained to be smooth (FIG. 6I).

Figure 6J:
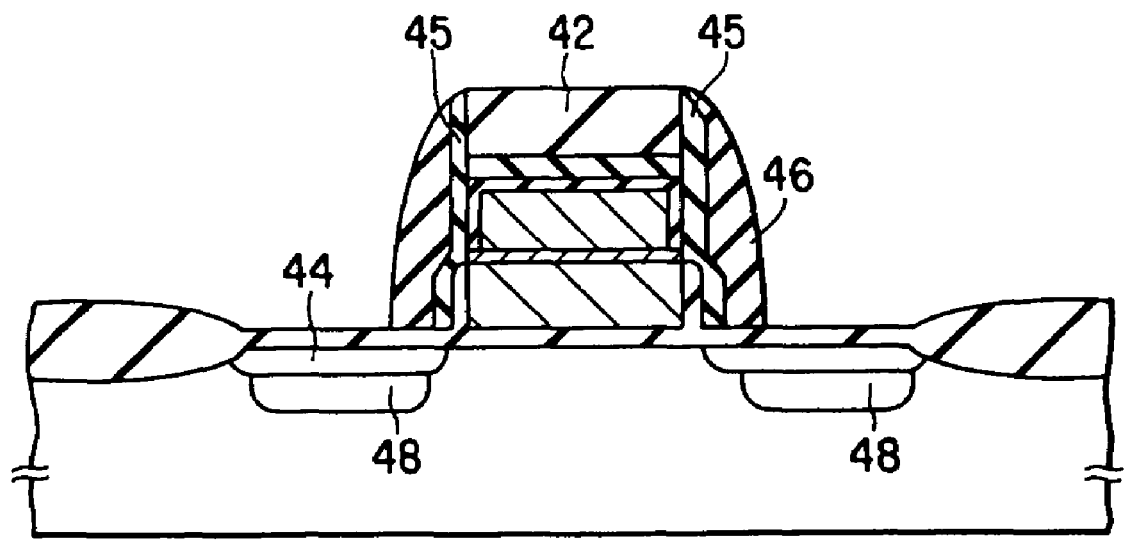

A gate sidewall insulator is then formed by etching the protection film back in the RIE process. Subsequently, in the normal ion implantation process, As ions accelerated to 40 keV are doped in dose of $1 \times 10^{15}/cm^{-2}$ to form source and drain regions 48 with use of the gate electrode and the gate sidewall insulator as a mask (FIG. 6J).

The processes of depositing a $SiO_2$ film in accordance with the CVD; forming of contact holes; and forming of an Al wiring are followed thereto, and then a finished MOS FET is obtained.

The NMOS transistors are described in the above-mentioned embodiments. PMOS transistors can be also formed in the same manner merely by changing the impurity to be doped.

The Fourth Embodiment

The semiconductor device according to the fourth embodiment of the present invention will be described below with reference to FIGS. 8A–8H.

Firstly, an element isolation oxide film 52, elements such as a MIS FET 53, wiring, and the like are formed on the semiconductor substrate 51. Then, the interlayer insulating film 54 formed of the silicon oxide or the like is deposited and planarized in the CMP process. The MIS FET 53 may be formed in accordance with either the methods used in the above-mentioned embodiments or other methods (FIG. 8A).

Subsequently, contact holes are formed on the interlayer insulating film 54, for connecting the elements and the wirings with the upper wirings (FIG. 8B).

Next, in order to prevent the diffusion of metal between the upper and lower wirings or among the elements, the diffusion barrier layer 55 formed of TiN (titanium nitride) or the like and having a thickness around 30 nm is formed in the sputtering or CVD process (FIG. 8C).

A W film 56 is then deposited on the interlayer insulating film 54 in the CVD process so as to fill the contact hole and form a wiring having a necessary thickness (250 nm, preferably) as a wiring (FIG. 8D).

Figure 7:
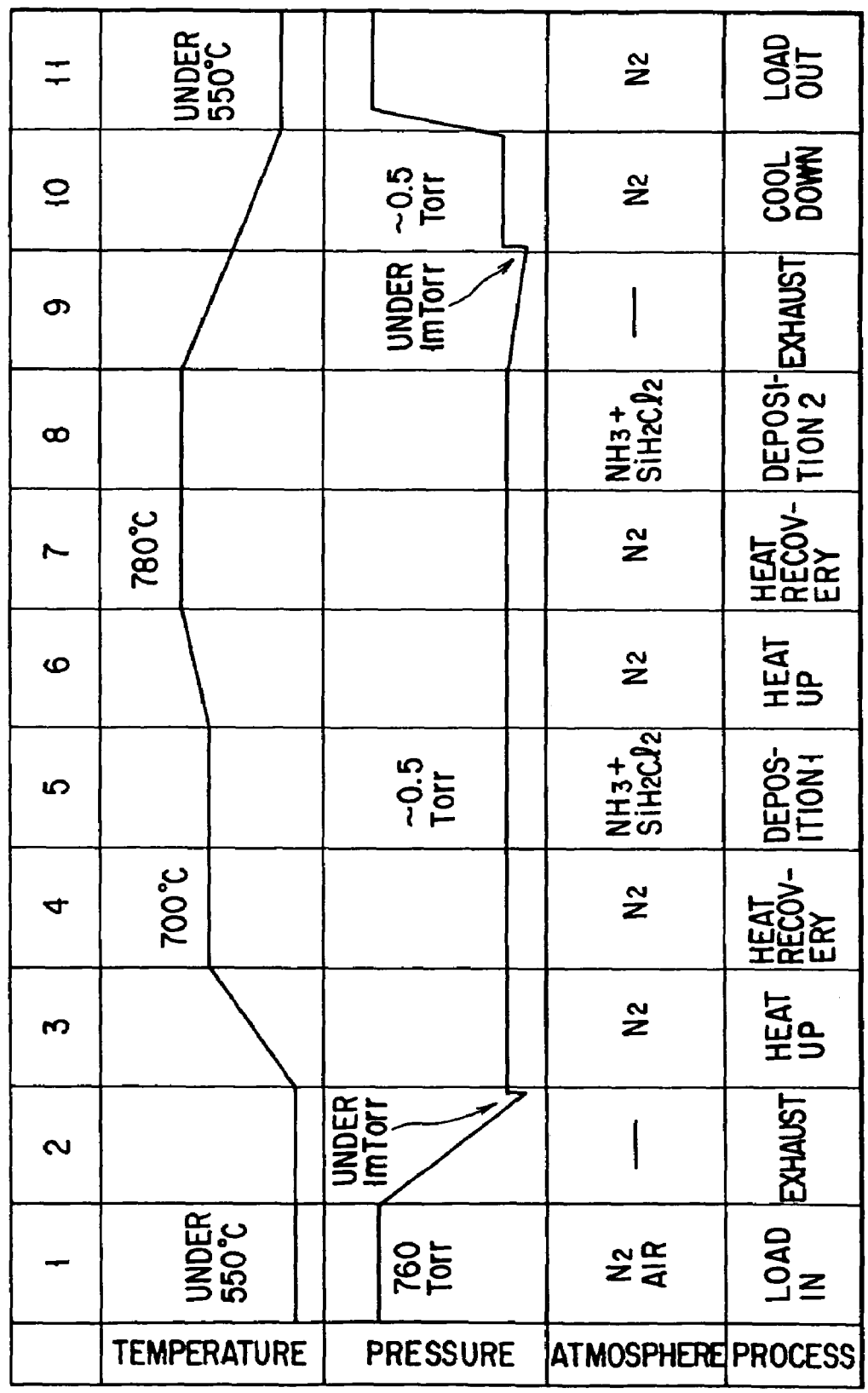
FIG. 7 is a view more specifically showing a part of the steps of the manufacturing method according to the third embodiment of the present invention.

Next, a protection film is formed on the W film 56 in accordance with the method shown in FIG. 7, similarly to the third embodiment. At first, the semiconductor substrate is introduced into a low pressure CVD chamber at a temperature below 550° C. In this time, a tungsten oxide film 57 is formed on the surface of the W film 56. The tungsten oxide film 57 is good at the chemical resistance, as described in the third embodiment.

As shown in a step 5 of FIG. 7, the silicon nitride film 58 as the first protection film having a thickness around 10 nm is firstly formed at a temperature below 750° C. (700° C., for example). Secondary, a silicon nitride film 59 as the second protection film having a thickness around 100 nm is deposited at 780° C. after the temperature of the same chamber is raised thereto.

In this manner, the present invention attains not only the effect that the protection film is formed as flat on the W film 56 (FIG. 8E), but also the effect that the protection film 57 can be used as a part of the tungsten oxide film against chemicals (FIG. 8E).

Next, the W film 56 and the protection film and the like are patterned to form a wiring 60 (FIG. 8F) Then, tungsten oxide film 61; a silicon nitride film 62 as the first protection film; and a silicon nitride film 63 as the second protection film are formed on the sidewall of the wiring 60 by the method similar to that shown in FIG. 7 (FIG. 8G).

These protection films are then etched back in the anisotropic etching process such as reactive ion etching process, to form a gate sidewall insulating stacked film composed of 62' and 63' (FIG. 8H).

Another interlayer insulating film is deposited thereon, and a multilayer wiring device can be attained by performing the steps shown in FIGS. 8A–8H again.

When the multilayer wiring is formed in the device as described above, the contact hole can be formed without providing a space between the contact hole and the wiring, as shown in FIG. 9, since the wiring is covered with a silicon nitride film and the interlayer insulating film is formed mainly of a silicon oxide.

When the etching process is performed such that the silicon oxide film is selectively etched to lease the silicon nitride film not etched, the contact hole can be formed without exposing the wiring to the outside. In such a structure, the distance between the wirings can be reduced. In FIG. 9, 64 denotes an interlayer insulating film, 65 denotes a barrier layer, and 66 denotes a contact hole.

According to the manufacturing process shown in the embodiments described above, wirings such as a gate wiring having a sheet resistance as low as 1Ω/square can be formed, and a stable protection film surrounding the wiring can be obtained.

In each of the above embodiments, the cases in which W is used as a metal film is described. However, the other metal can be oxidized and crystallized in various manners at various temperatures under various partial pressures of oxygen. Accordingly, the present invention can be applied to the case using the metal (in particular, refractory metal) other than W. For example, the case using Ta, it is known that $Ta_6O$ is exist at a temperature below 350° C., $Ta_4O$ is exist at a temperature below 500° C., and $Ta_2O$ is exist at a temperature between 350° C. and 1200° C. Also in these cases, the volume of the metal oxide is changed according to the change in the temperature and the surface is damaged. The smooth surface can be thus attained by performing the reduction process at the temperature lower than the critical temperature or forming the first protection film.

Similarly, in the above embodiments, the case where the silicon nitride film is mainly used as the protection film is described. The other film having good resistance to heat and chemicals so as to protect a metal film, may be used.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

The invention claimed is:

1. A manufacturing method of a semiconductor device comprising:
   forming a metal film on a main surface of a semiconductor substrate;
   forming an oxide film on an upper surface of the metal film by exposing the metal film to an oxidizing gas;
   after forming the oxide film, reducing the oxide film in a reducing atmosphere;
   after reducing the oxide film, forming a protection film on the metal film;
   prior to forming the oxide film, forming a gate insulating film on the semiconductor substrate, the semiconductor substrate being formed of silicon; and
   forming a wiring film on the gate insulating film, the wiring film including a silicon film upon which the metal film is formed.

2. A manufacturing method according to claim 1, wherein the metal film is a tungsten film.

3. A manufacturing method according to claim 1, wherein the protection film is a silicon nitride film.

4. A manufacturing method according to claim 1, further comprising, between forming the wiring film and forming the oxide film, forming a gate wiring by patterning the wiring film,
   wherein forming the oxide film includes forming the oxide film on the gate wiring.

5. A manufacturing method according to claim 1, further comprising, after forming the protection film, selectively oxidizing the semiconductor substrate and the silicon film;
   wherein selective oxidizing includes processing a semiconductor substrate, on which the silicon film and the metal film are formed, in an atmosphere containing a gas which does not oxidize the metal film.

* * * * *